United States Patent [19]

Faure et al.

[11] 4,063,172

[45] Dec. 13, 1977

[54] MULTIPLE SITE, DIFFERENTIAL DISPLACEMENT, SURFACE CONTACTING ASSEMBLY

[75] Inventors: Louis Henry Faure; Howard Thomas Johnston, Jr., both of Poughkeepsie; Dana Roberts Townsend, Fishkill, all of N.Y.

[73] Assignee: International Business Machines Corporation, Armonk, N.Y.

[21] Appl. No.: 691,685

[22] Filed: June 1, 1976

[51] Int. Cl.[2] .......................................... G01R 31/02
[52] U.S. Cl. .............................. 324/158 P; 324/72.5; 324/158 F
[58] Field of Search ............... 324/158 P, 158 F, 72.5; 339/176 M

[56] References Cited

U.S. PATENT DOCUMENTS 3,963,985  6/1976  Geldermans ...................... 324/158 F
3,970,934  7/1976  Aksu ................................ 324/158 F Primary Examiner—Rudolph V. Rolinec
Assistant Examiner—Ernest F. Karlsen
Attorney, Agent, or Firm—Henry Powers

[57] ABSTRACT

A multiple site probe for simultaneous probing of multiple chip site clusters of pads. The multiple site probe assembly includes a mounting plate having a plurality of groups of adjustably mounted probes thereon. A plurality of cams cooperate with cam followers associated with individual groups of probes, each of the cam and cam followers having a displacement which is dependent upon its distance from a predetermined and fixed reference relative to the mounting plate. An actuator is connected to the cams so as to effect simultaneous actuation of the cams and to allow for differential displacement of each group of the groups of probes so as to compensate for accumulated tolerances and/or shrinkage of the substrate.

9 Claims, 7 Drawing Figures

MULTIPLE SITE, DIFFERENTIAL DISPLACEMENT, SURFACE CONTACTING ASSEMBLY

SUMMARY OF THE INVENTION AND STATE OF THE PRIOR ART

The present invention relates to surface contacting assemblies, and more particularly relates to a multiple site test probe assembly in which the probes are arranged in groups so as to facilitate testing of a group or cluster of chip site pads, and includes means for differentially adjusting the displacement of the groups of probes so as to compensate for accumulated tolerance and/or shrinkage differences in the substrate to be tested.

The art is replete with structures utilized for probing very small pads in extremely close proximity, for example, U.S. Pat. No. 3,611,128 illustrates a probe header which has a plurality of probes for effecting a temporary test connection with the integrated circuits on a semiconductor wafer, the probes of which are assembled into a plurality of integral units, each of the units being mounted on adjusting means to enable simultaneous adjustment of a plurality of probes at each probe unit. However, once the probes are set, then they are not adjustable to compensate for accumulated tolerance differences and/or shrinkage of the substrate. In a like manner, the Kulischenko et al Patent 3,551,807 illustrates a manually adjustable electrical probe for testing printed circuits and the like in which the probe head itself is adjustable in all directions relative to its fixed supporting body. However, the adjustments are manual and do not permit automatic compensation for tolerance differences between adjacent sites to be probed on a substrate.

There are numerous other instances in the prior art of multiple and single probes for contacting pads or the like on substrates to permit of probing closely adjacent contacts or pads on a substrate. However, all of the prior art lacks the ability to probe simultaneously a plurality of, for example, chip site clusters of pads when the pads are spaced apart a sufficient distance to incur probe alignment problems because of either shrinkage or accumulated tolerances which may exist between the chip site clusters of the pads.

In view of the above, it is a principal object of the present invention to provide a multiple site surface contacting assembly and particularly a probe assembly which may probe a plurality of chip site clusters of pads, which clusters are spaced apart from one another and because of the distance between adjacent clusters encounter alignment problems due to accumulated tolerances in manufacture of the substrate or shrinkage or expansion of the substrate due to the material used and/or environmental conditions.

Yet another object of the present invention is to provide a novel multiple site test probe assembly in which a plurality of closely spaced contacts may be probed for test purposes, simultaneously.

Still another object of the present invention is to provide a novel multiple site test probe assembly in which a single adjustment will allow for differences in positon between adjacent clusters of contacts or pads on the group of probes associated with the contact area.

Other objects and a more complete understanding of the invention may be had by referring to the following specification and claims taken in conjunction with the accompanying drawings in which:

Figure 1:
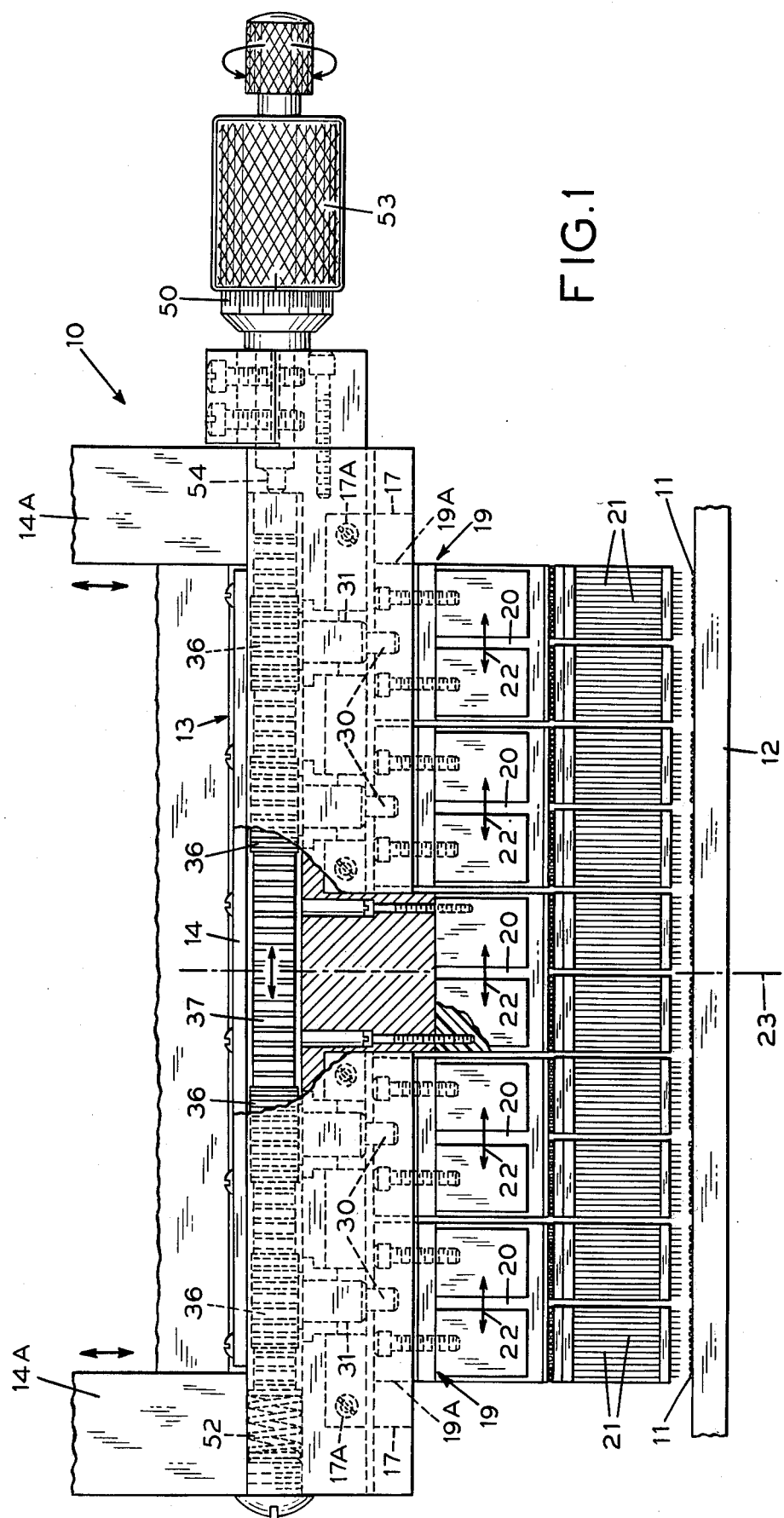
FIG. 1 is a fragmentary side elevational view illustrating apparatus constructed in accordance with the present invention.

Turning now to the drawings, and especially FIG. 1 thereof, a multiple site surface contacting assembly, in the present instance a probe assembly 10 especially adapted for simultaneous probing of pads or contacts 11 on a substrate 12 is illustrated therein. The substrate may be a printed circuit board or card, a length of ceramic or even a flexible insulator having a plurality of contacts or chip site clusters of pads 11 thereon, the clusters being spaced apart a sufficient distance to incur probe alignment problems because of accumulated tolerances and/or shrinkage of the substrate when probing of the clusters of pads is attempted (for test purposes) prior to the mounting of semiconductor chips thereon. Conventionally, testing will take place before the mounting of the semiconductor chips to insure proper conductivity, opens and shorts between various pads of the clusters as well as pads of the same cluster.

In accordance with the invention, the multi-site probe assembly 10 is especially adapted for probing the pads of the clusters of pads while permitting simultaneous adjustment of the probes to compensate for accumulated tolerance and/or shrinkage problems of the substrate. To this end, and referring first to FIG. 1, the multi-site probe assembly 10 includes mounting means 13 from which depend a plurality of groups 20 of surface impinging contactors or probes 21 which are mounted for lateral movement thereof in the direction of the arrows 22 relative to the mounting means 13. The group 20 of probes 21 are sometimes referred to as space transformers, and while they shall be described in more detail hereinafter, such a transformer is illustrated in the IBM Technical Disclosure Bulletin, Volume 18, No. 1, June, 1975 at page 120. Each of the groups 20 of the groups of probe 21 is driven by differential displacement means so as to provide a displacement of the group which is dependent upon its distance from a reference, in the illustrated instance the reference being the center line of the assembly 10 as at or along line 23, but the reference may be at the right or left end of the assembly or even a remote reference, depending upon where the reference point is taken, for measurement purposes, on the substrate 12. The differential displacement means includes a plurality of cam means which cooperate with cam follower means, in the illustrated instance associated with each group 20 of the probes 21. Actuating means 50 interconnect all of the cam means to effect simultaneous actuation thereof to cause differential displacement of each group 20 of the probes 21, the displacement being dependent upon the groups distance from the reference.

In order to permit accurate differential displacement of each group 20 of the groups of probes 21, it is desirable that the mount for the groups be strong and rigid while permitting low frictional displacement of the groups of probes. To this end, and referring now specifically to FIGS. 2, 3 and 3A, the mounting means 13 includes a plate or the like 14 which is connected to brackets 14A which are connected to a test machine (not shown) to permit vertical reciprocation of the multiple site probe assembly 10. The plate 14 is connected to spaced apart support members 15A, 15B (FIG. 3A) which form a chamber 16 therebetween. A longitudinally extending guide 17 is coupled to the support member 15A as by bolts 17A which guide includes a portion of a dove tail way 18 which cooperates with a dove tail 19A on individual slides 19 which are coupled to an associated group 20 of probes 21.

Figure 3:
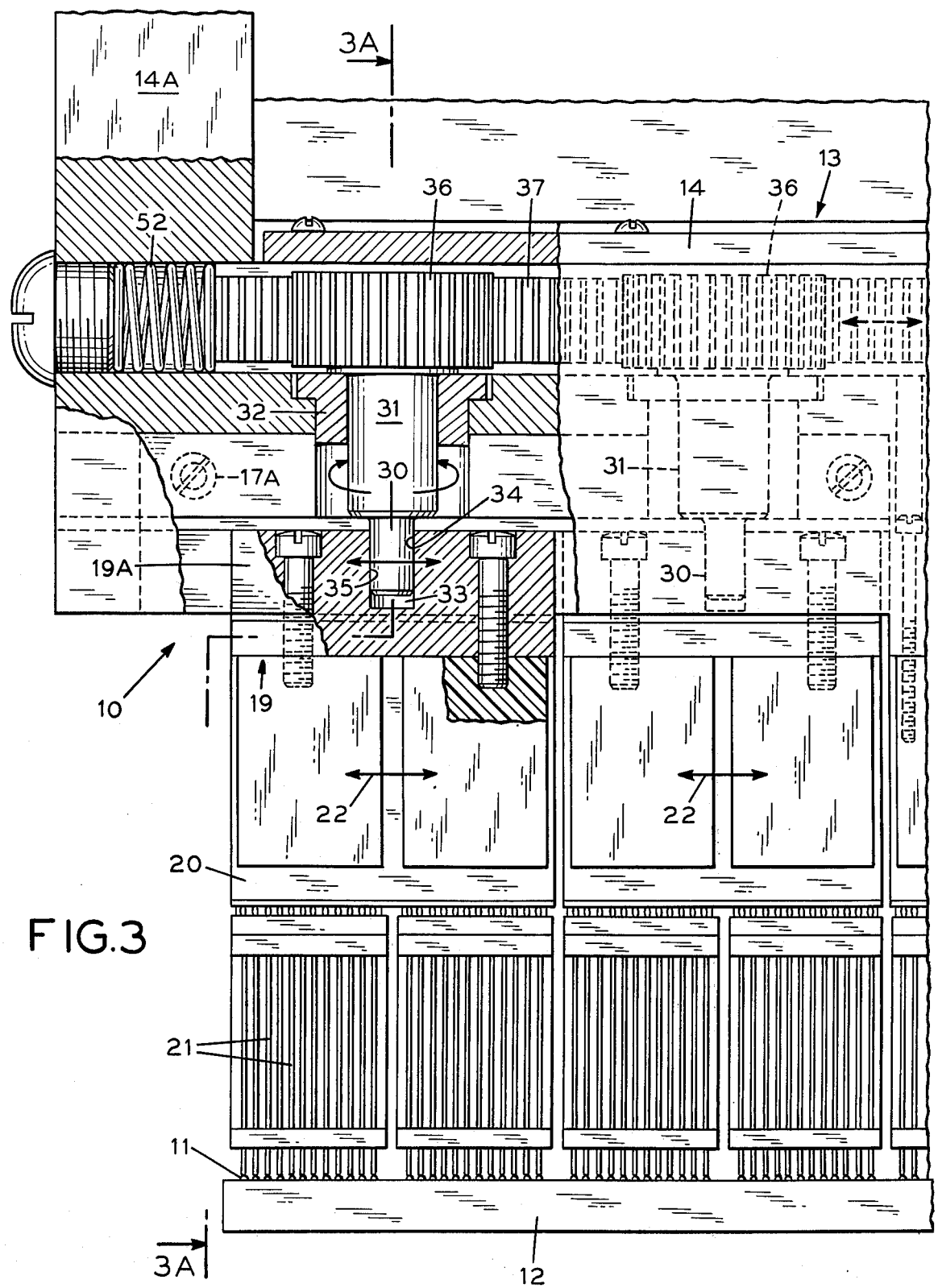
FIG. 3 is an enlarged fragmentary sectional view showing another portion of the apparatus illustrated in FIG. 1.
Figures 3A, 4:
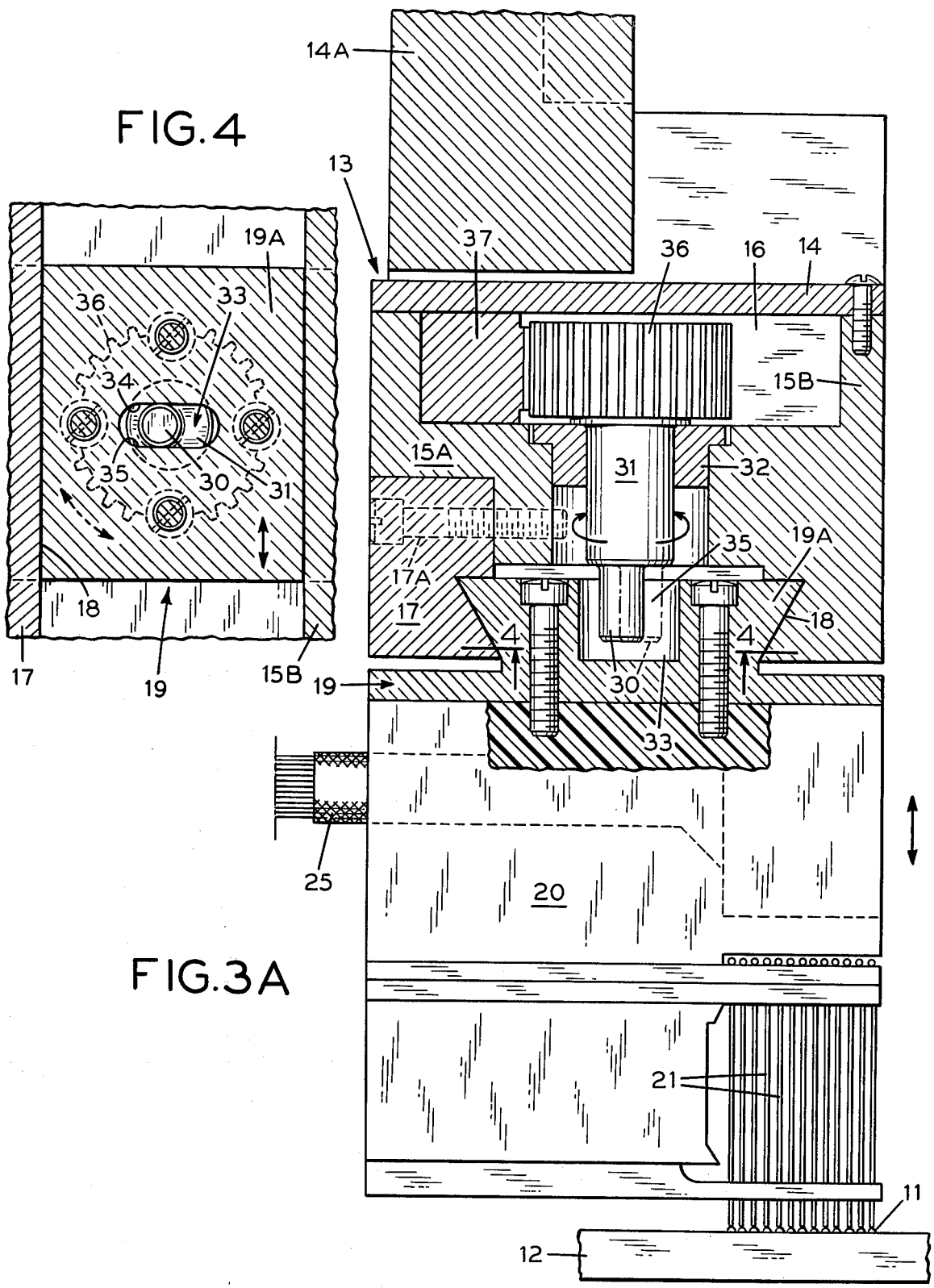
FIG. 3A is an enlarged fragmentary sectional view taken along line 3A—3A of FIG. 3.
FIG. 4 is a fragmentary sectional view taken along lines 4—4 of FIG. 3A.

As previously explained, each of the groups 20 has a displacement which is dependent upon its distance from the reference, in the present instance the reference being the center line of the assembly 10. To this end, and as best shown in FIGS. 3 and 3A, each of the groups 20 has associated therewith a cam or eccentric 30 which is coupled to a shaft 31 which is mounted for rotation in a sleeve insert 32 captured between the support members 15A and 15B respectively. The cam 30 extends into an opening or socket 33 in the slide 19 which includes spaced apart and opposed wall members 34 and 35 which act as a cam follower in association with the cam 30. Accordingly, as the shaft 31 is rotated, the cam 30 abuts the walls 34 and 35 of the socket 32 effecting a displacement of the slide 19 in the direction of the arrows 22 (FIG. 1). Moreover it should be noted that each of the cams 30 associated with each group 20 of probes 21 has a throw or displacement that is different than the throw or displacement of the cam associated with the adjacent group. Thus the cam associated with the group 20 on either side of the reference 23 will have a displacement or throw that is less than the displacement or throw of the next adjacent outboard cam so that the outboard group may be moved further or closer (as the case may be) than the next adjacent group, relative to the reference.

Figure 2:
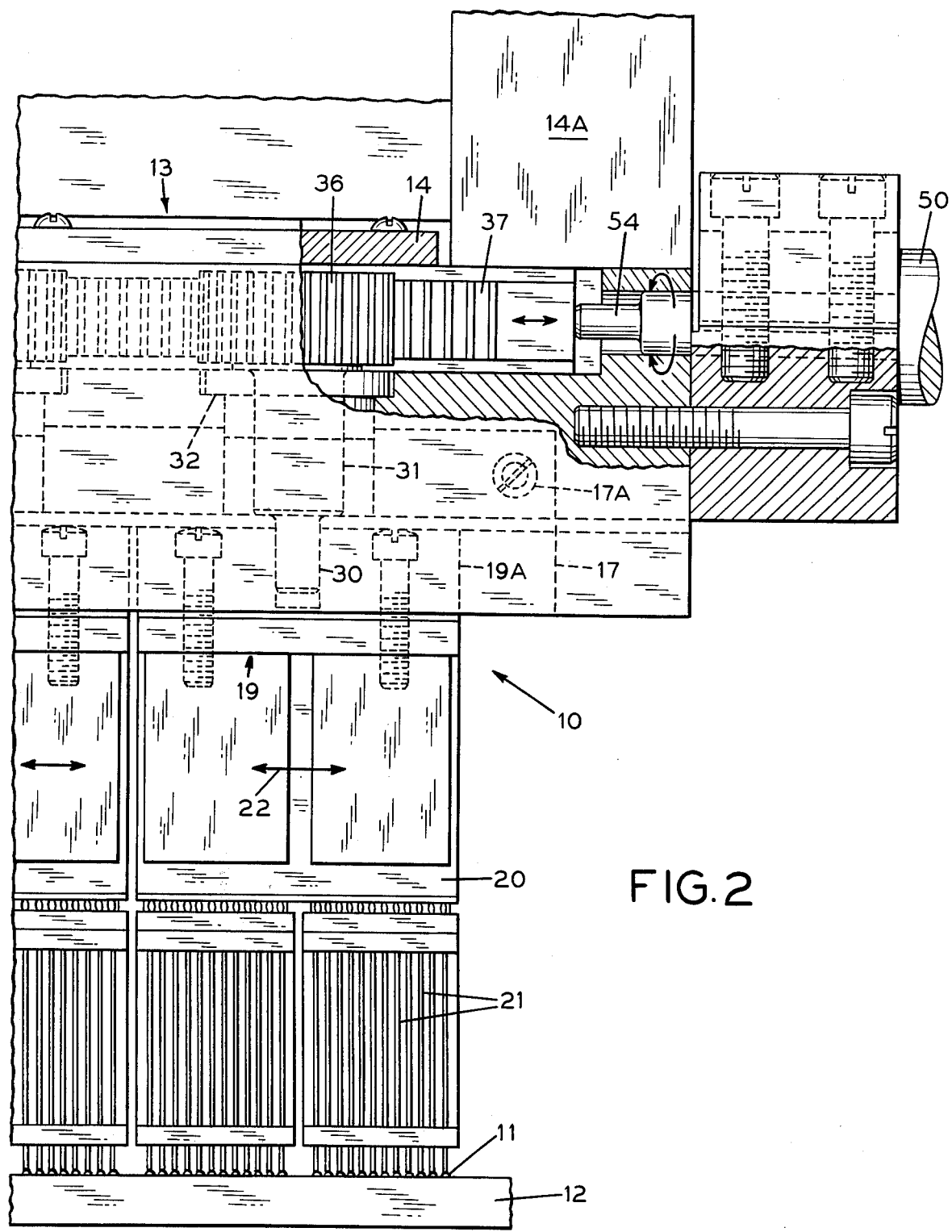
FIG. 2 is an enlarged fragmentary sectional view of a portion of the apparatus illustrated in FIG. 1.

All of the cams are connected to the actuating means 50 so that displacement of the groups may be effected simultaneously. To this end, and as best shown in FIGS. 1-3, each of the shafts 31 is connected to a gear 36 which is coupled to the mating teeth of a rack 37 which is mounted for lateral or sliding reciprocation in the chamber 16 intermediate the plate 14 and one of the support members, in the present instance member 15A. As shown in FIG. 3, the rack 37 is in turn biased as by a compression spring 52 which tends to move the rack laterally (reference FIG. 1) to the right. On the mount or frame at the opposite end of the rack is a micrometer means rotating actuator 53 including a shaft 54 which abuts the rack 37 and, upon rotation thereof permits movement of the rack to effect rotation of the gear 36 and thus the cams 30. Thus as the rack is moved, each of the groups 20 is differentially displaced due to the difference in the throw of its associated cam allowing for differences due to shrinkage or accumulated tolerances to be compensated for automatically.

Figure 5:
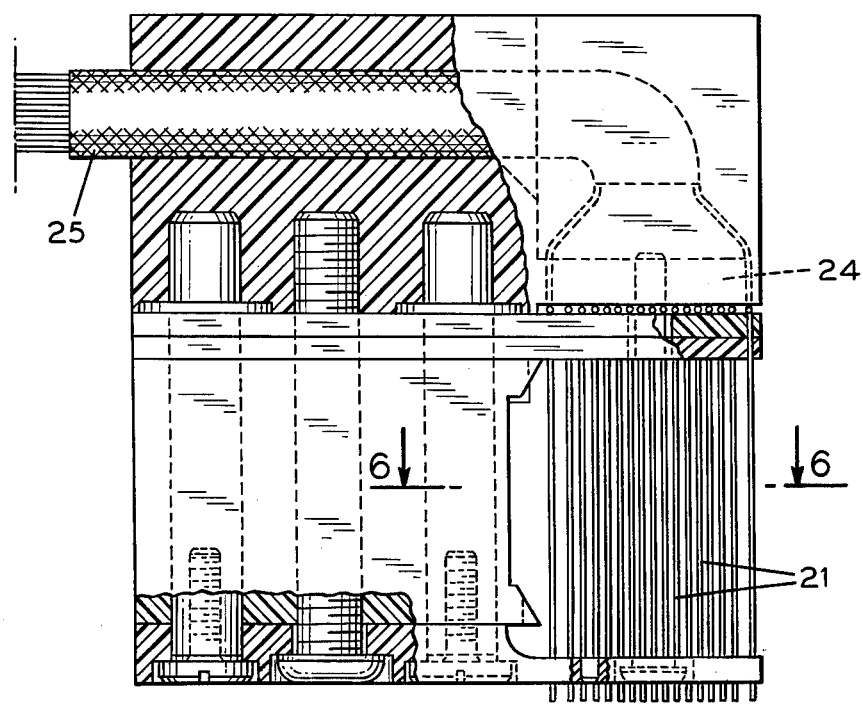
FIG. 5 is an enlarged fragmentary sectional view inside elevation of a portion of the apparatus illustrated in FIGS. 1-4.
Figure 6:
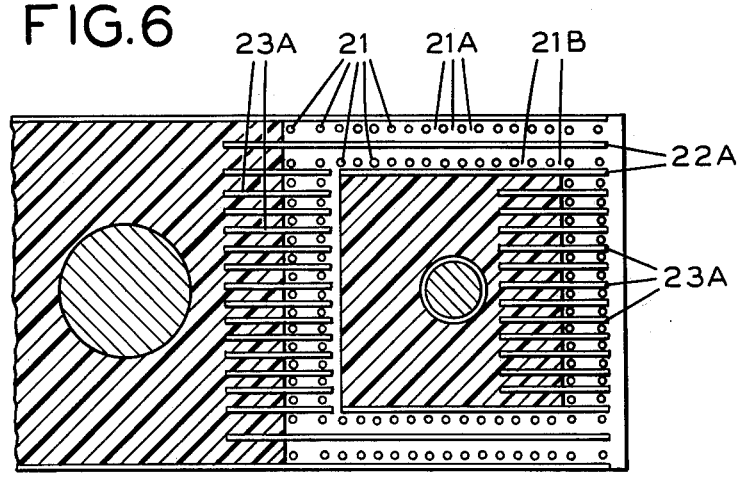
FIG. 6 is a fragmentary sectional view taken along lines 6—6 of FIG. 5.

While the probe structure may take any convenient form such as that illustrated in the heretofore identified IBM Technical Disclosure Bulletin, or in IBM Technical Disclosure Bulletin, Volume 18, No. 5, October 1975, page 1378 or in Volume 18, No. 3, August 1975, page 701, a structure such as illustrated in FIGS. 5 and 6 will suffice for multiple probing of micro-miniature or other small contacts or pads. It should be noted that the preferred structural embodiment is as taught in U.S. Pat. No. 3,806,801, issued on Apr. 23, 1974 which is hereby incorporated by reference. As illustrated in FIGS. 5 and 6, the probes 21 are arranged in rows 21A and 21B in a box pattern. Needless to say, the probes are arranged so they are spaced the same as the contacts on the substrate, and include insulators 22 intermediate the rows of probes as well as short insulators 23 intermediate adjacent rows to prevent the probes (which are long as compared to their thickness) from contacting each other upon the probes making contact with the pads 11 on the substrate 12. The probes are sometimes referred to as "buckling beam" probes. As illustrated as in FIG. 5, the upper or remote ends of the probes connect through a connector 24 to a multi-wire cable 25 or the like which may be coupled to a suitable comparator (not shown) for comparing the actual electrical readout from the pads on the substrate under test to that which it should be.

Thus the multiple site probe assembly of the present invention effectively compensates for accumulated tolerances over long substrates having small contact pads thereon which must be probed simultaneously when testing. This is accomplished by the technique of differential displacement which is dependent upon the distance of the probe cluster from its reference.

Although the invention has been described with a certain degree of particularity, it is understood that the present disclosure has been made only by way of example and that numerous changes in the details of construction, the combination and arrangement of parts and the mode of operation may be made without departing from the spirit and the scope of the invention as hereinafter claimed.

What is claimed is:

1. A multiple site surface contacting assembly comprising in combination:
a mount, a plurality of groups of surface impinging contactors; means mounting said groups for movement thereof relative to said mount; a reference; a plurality of cam means and at least some of said groups of surface impinging contactors of said plurality of groups having cam follower means for association with a cam means of said plurality of cam means; each of said cam and cam follower means having a displacement dependent upon its distance from said reference; and actuating means connected to said cam means for effecting simultaneous actuation of said cam means.

2. A multiple site surface contacting assembly in accordance with claim 1 wherein said actuating means comprises gear means mounted for rotation in said mount and connected to each of said cam means, and rack means engaging each of said gear means for effecting rotation thereof.

3. A multiple site surface contacting assembly in accordance with claim 2 including micrometer means connected to said rack means.

4. A multiple site surface contacting assembly in accordance with claim 1 including slide means connected to said surface impinging contactors, said cam follower means being in said slide means.

5. A multiple site probe comprising in combination:

a mount, a plurality of groups of probes, means mounting said groups of probes for movement thereof relative to said mount; a reference; and differential displacement means interconnecting each of said groups of probes so that each of said groups has a displacement dependent upon its distance from said reference, wherein said differential displacement means comprises cams and cam followers, each of said groups having a cam and a cam follower associated therewith and means for effecting simultaneous actuation of one of said cam and cam followers of each of said groups.

6. A multiple site probe in accordance with claim 5 wherein said means for effecting simultaneous actuation of said cams and cam followers comprises gear means connected to each of said cams, and rack means connected to each of said gears whereby motion of said rack means effects simultaneous motion of said cams and thus said cam followers.

7. A multiple site probe comprising in combination: a mounting plate, a plurality of groups of probes; means mounting said groups of probes for movement thereof relative to said mounting plate; a reference; a plurality of cam means and at least some of said groups of probes of said plurality of groups having cam follower means for association with a cam means of said plurality of cam means; each of said cam and cam follower means having a displacement, upon actuation thereof, dependent upon its distance from said reference; and actuating means connected to said cam means for effecting simultaneous actuation of said cam means.

8. A multiple site probe in accordance with claim 7 wherein said mounting plate includes a support member, a plurality of gear means mounted for rotation in said support member, each of said gear means connected to a cam means, and rack means interconnecting said gear means so that linear movement of said rack means effects simultaneous rotation of said gear means.

9. A multiple site probe in accordance with claim 8 including a micrometer means connected to said rack means to effect said linear movement.

* * * * *